(12) United States Patent
Sun-E et al.

(10) Patent No.: US 8,551,878 B2
(45) Date of Patent: Oct. 8, 2013

(54) METAL INTERCONNECTION METHOD OF SEMICONDUCTOR DEVICE

(75) Inventors: Park Sun-E, Daejeon (KR); Park Younghoon, Suwon-si (KR); Han Joocheol, Hwaseong-si (KR); Chung Jinkuk, Incheon (KR); Kang Kiho, Hwaseong-si (KR); Ahn Yu Jin, Seongnam-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 363 days.

(21) Appl. No.: 12/827,627

(22) Filed: Jun. 30, 2010

(65) Prior Publication Data
US 2011/0008957 A1 Jan. 13, 2011

(30) Foreign Application Priority Data
Jul. 13, 2009 (KR) .................. 10-2009-0063630

(51) Int. Cl.
*H01L 21/283* (2006.01)
(52) U.S. Cl.
USPC .................. 438/633; 438/672; 257/E21.582

(58) Field of Classification Search
USPC .......... 438/622, 633, 637, 672; 257/E21.582, 257/E21.585
See application file for complete search history.

(56) References Cited

U.S. PATENT DOCUMENTS

| | | | |
|---|---|---|---|
| 6,221,765 B1 | 4/2001 | Ueno | |
| 6,699,749 B1 * | 3/2004 | Lee et al. | 438/240 |
| 6,713,407 B1 * | 3/2004 | Cheng et al. | 438/775 |
| 2006/0110917 A1 * | 5/2006 | Chen et al. | 438/653 |
| 2007/0134913 A1 * | 6/2007 | Zheng et al. | 438/627 |

FOREIGN PATENT DOCUMENTS

| | | |
|---|---|---|
| JP | 2000-77360 | 3/2000 |
| JP | 2005-353947 | 12/2005 |
| KR | 10-0352569 | 8/2002 |
| KR | 10-0705950 | 4/2007 |

* cited by examiner

*Primary Examiner* — Wensing Kuo
(74) *Attorney, Agent, or Firm* — Muir Patent Consulting, PLLC

(57) ABSTRACT

A metal interconnection method of a semiconductor device includes forming a copper layer on a semiconductor substrate and planarizing the copper layer. Two thermal treatments are performed at different temperatures between formation of the copper layer and planarization of the copper layer.

16 Claims, 6 Drawing Sheets

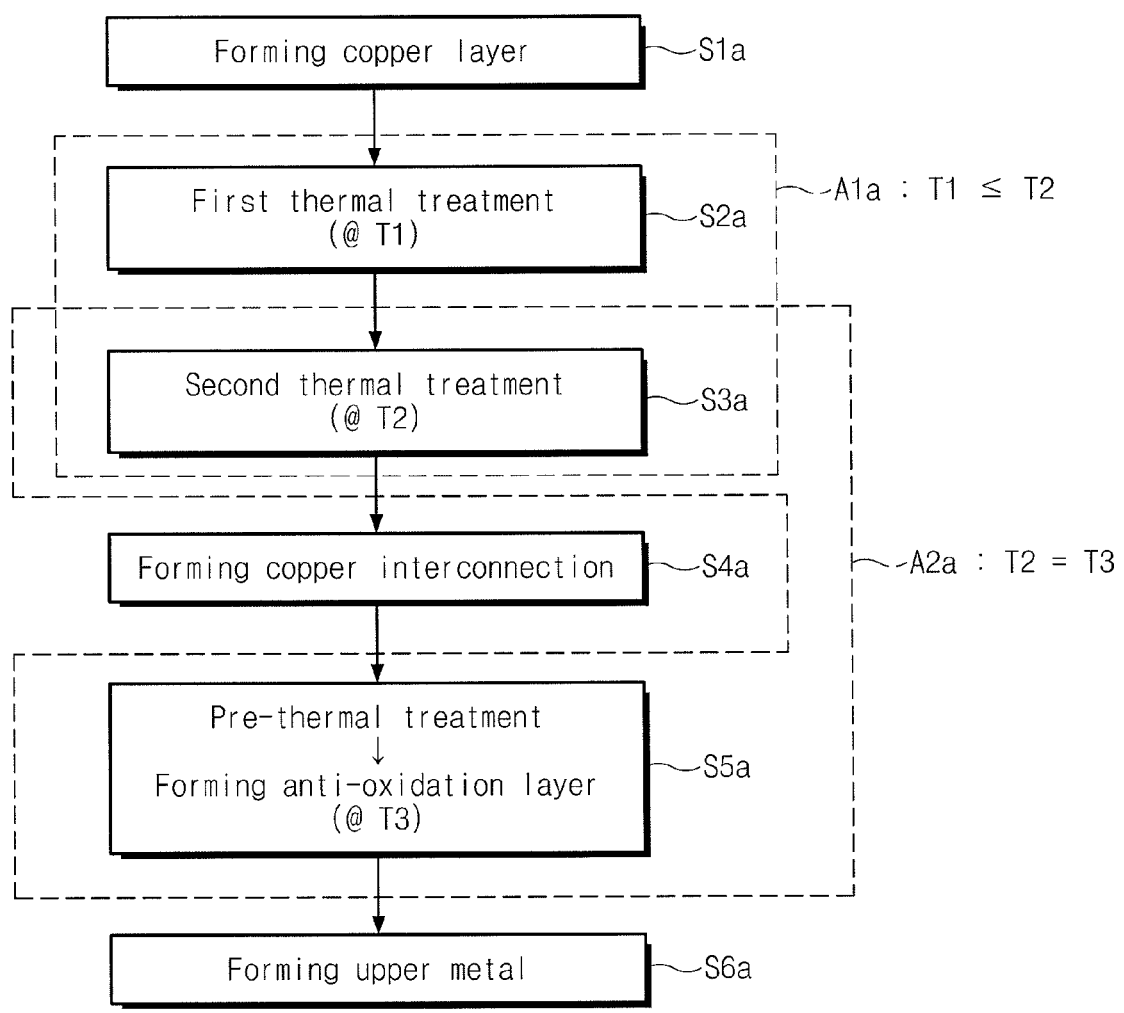

US 8,551,878 B2

METAL INTERCONNECTION METHOD OF SEMICONDUCTOR DEVICE

CROSS-REFERENCE TO RELATED APPLICATIONS

This U.S. non-provisional patent application claims priority under 35 U.S.C. §119 of Korean Patent Application 10-2009-0063630, filed in the Korean Intellectual Property Office on Jul. 13, 2009, the entire contents of which are hereby incorporated herein by reference.

BACKGROUND

The present inventive concept relates to a metal interconnection method of a semiconductor device, and more particularly, to a copper interconnection method of a semiconductor device.

With advances in integrated circuit semiconductor devices and fabrication processes, demand for higher device operation speed and higher device integration has increased. As one of various technologies for meeting the increasing demand for such faster operation speed and high integration, a semiconductor device with a dimension of several tens of nanometers has been commercialized. However, a decrease in the critical dimension (CD) results in an increase in the resistance of metal interconnections and an increase in the electrostatic capacitance between the metal interconnections. As a result, in such devices, it is difficult to realize the high-speed operation.

In order to solve this problem, copper (Cu) has been used in a metal interconnection process, instead of aluminum (Al), which was used as a metal interconnection material. The copper (Cu) has smaller resistivity and better electric conductivity than aluminum (Al). The currently used copper interconnection has not only an advantage of reducing RC (Resistance-Capacitance) time delay but has excellent EM (Electro-Migration) characteristics and an excellent high melting point characteristic, resulting in excellent reliability characteristics.

In the copper interconnection process, however, dry etching the copper in forming a metal pattern can be difficult. For this reason, the copper interconnection process forms patterns by forming trenches and via holes to bury the copper after forming an inter-metal dielectric.

SUMMARY

The present inventive concept provides a metal interconnection method of a semiconductor device that can inhibit an occurrence of hillocks of a copper interconnection.

The present inventive concept also provides a metal interconnection method of a semiconductor device that can inhibit an occurrence of voids in a copper interconnection.

According to one aspect, the inventive concept is directed to a metal interconnection method of a semiconductor device, including: forming a copper layer on a semiconductor substrate; thermally treating the copper layer at a first temperature; thermally treating the copper layer at a second temperature; forming a copper interconnection by patterning the copper layer; and forming an anti-oxidation layer on the copper interconnection at a third temperature. The second temperature may be substantially equal to the third temperature.

In some embodiments, the second temperature is equal to or higher than the first temperature.

In some embodiments, the thermal treating of the copper layer at the second temperature and the forming of the anti-oxidation layer are performed in the same equipment.

In some embodiments, the thermal treating of the copper layer at the second temperature is performed in a short period of time compared to the forming of the copper layer at the first temperature.

In some embodiments, the forming of the anti-oxidation layer further includes performing pre-thermal treatment on the copper interconnection, and a temperature at which the pre-thermal treatment is performed is substantially equal to the third temperature.

According to another aspect, the inventive concept is directed to a method of fabricating a semiconductor device having an MIM (Metal-Insulator-Metal) structure. The method includes: forming a metal layer on a semiconductor substrate; thermally treating the metal layer at a first temperature; thermally treating the metal layer at a second temperature different from the first temperature; patterning the metal layer to form a metal pattern; forming an inter-metal dielectric on the metal pattern; and forming an upper metal pattern on the inter-metal dielectric. The inter-metal dielectric is interposed between the metal pattern and the upper metal pattern so as to form a capacitor having the MIM structure.

In some embodiments, the second temperature is equal to or higher than the first temperature.

In some embodiments, the second temperature is substantially equal to a temperature at which the inter-metal dielectric is formed.

In some embodiments, the thermal treating of the copper layer at the second temperature and the forming of the inter-metal dielectric are performed in the same equipment.

In some embodiments, the inter-metal dielectric formed on the metal pattern includes at least one of a silicon oxide layer ($SiO_x$), a silicon nitride layer ($SiN_x$), an ONO layer (Oxide/Nitride/Oxide), a hafnium oxide layer ($HfO_x$), an aluminum oxide layer ($Al_2O_3$), and a multilayered insulating layer formed in combination therewith.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to describe the inventive concept.

FIG. 3 is a flowchart of processes according to an embodiment of the inventive concept.

DETAILED DESCRIPTION OF THE EMBODIMENTS

Figure 1A:
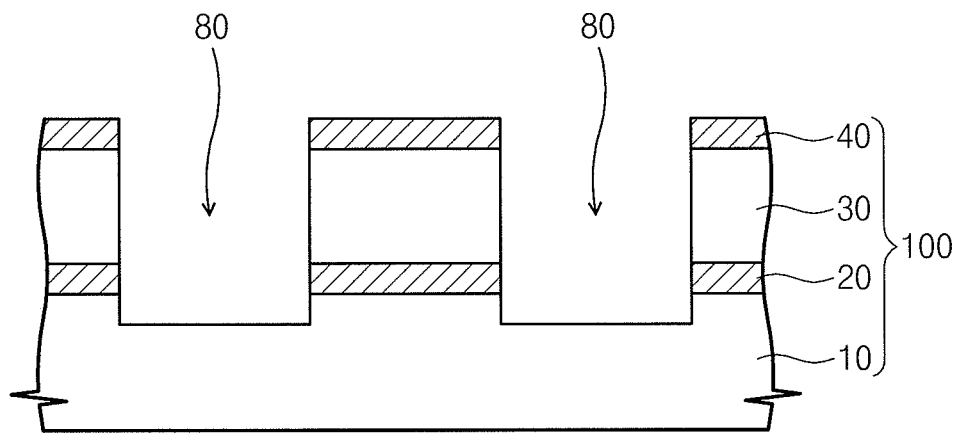
FIGS. 1A through 1H are sectional views illustrating a metal interconnection method of a semiconductor device according to embodiments of the inventive concept.

Hereinafter, preferred embodiments of the present invention concept will be described in detail with reference to the accompanying drawings. The exemplary embodiments of the inventive concept may, however, be embodied in many different forms and should not be construed as being limited to the embodiments set forth herein. Rather, these embodiments are provided so that this description will be thorough and complete and will fully convey the inventive concept to those skilled in the art. In the drawings, the thickness of layers and regions is exaggerated to effectively describe technical details. It will be understood that when any layers are referred to as being "on" another material layer or substrate, it may be directly on the other material layer or substrate or an intervening third layer may be present therebetween. Like reference numerals refer to like elements throughout the specification.

In general, a copper interconnection method of a semiconductor device includes patterning an inter-metal dielectric, burying copper to fill the patterned region, planarizing the buried copper by a chemical mechanical polishing (CMP) process, and forming an anti-oxidation layer to prevent the oxidation of the surface of the buried copper. In this case, the anti-oxidation layer is formed at about 350 to 400° C. A hillock may occur on the surface of the buried copper due to a thermal stress. Moreover, a pin-hole, a void, or the like may occur on the surface of the copper due to a loss of copper atoms caused by a mechanical stress in the subsequent process.

FIGS. 1A through 1H are sectional views illustrating a metal interconnection method of a semiconductor device according to embodiments of the inventive concept.

Referring to FIG. 1A, an inter-metal dielectric (IMD) structure 100 having openings 80 may be formed on a semiconductor substrate. The inter-metal dielectric structure 100 may include a plurality of dielectric thin layers sequentially stacked. The openings (which define regions where copper interconnections are formed in subsequent processes) may be formed through at least one of the dielectric thin layers.

More specifically, the inter-metal dielectric structure 100 may include a first inter-metal dielectric 10 and a second inter-metal dielectric 30 sequentially stacked. According to an embodiment of the inventive concept, a first etching stop layer 20 may further be formed between the first inter-metal dielectric 10 and the second inter-metal dielectric 30. Moreover, a second etching stop layer 40 may further be formed on the second inter-metal dielectric 30. The openings may be formed to expose at least the upper surface of the first etching stop layer 20 or the upper surface of the first inter-metal dielectric 10.

The first etching stop layer 20 may be formed of at least one of materials having etching selectivity with respect to the first inter-metal dielectric 10 or the second inter-metal dielectric 30 to prevent the first inter-metal dielectric 10 from being excessively etched in an etching process for forming the openings 80. For example, when the first inter-metal dielectric 10 and the second inter-metal dielectric 30 are formed of a silicon oxide, the first etching stop layer 20 may be formed of a silicon nitride (SiNx) or a silicon oxynitride (SiON). Moreover, the second etching stop layer 40 may be formed of at least one of materials capable of preventing excessive polishing in the subsequent chemical mechanical polish (CMP).

The inter-metal dielectric structure 100 may be formed of a single layer. For example, the inter-metal dielectric structure 100 may be formed of an interlayer dielectric of a single layer and an etching stop layer of a single layer.

Figure 1B:
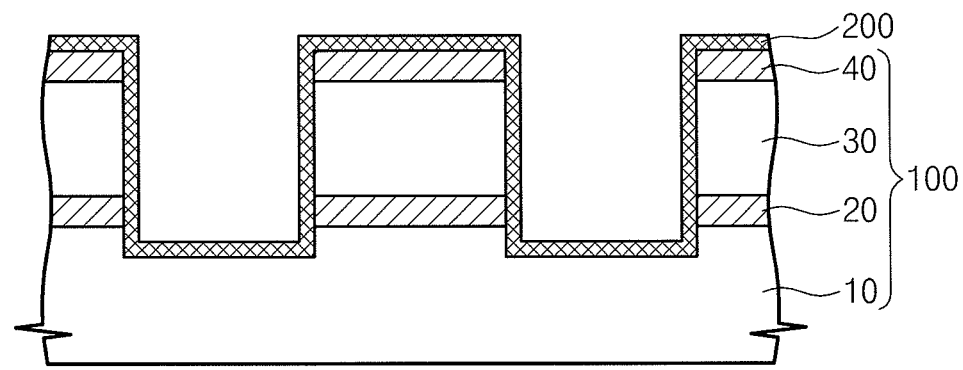
Figure 1C:
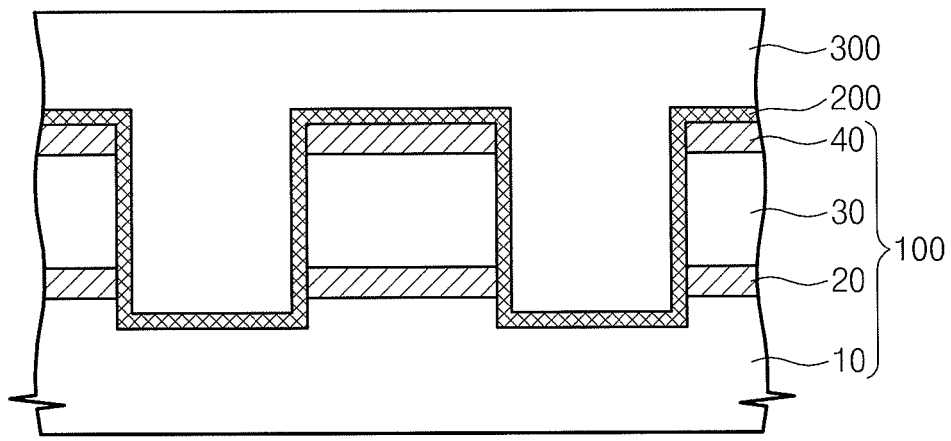

Referring to FIGS. 1B and 1C, a barrier metal 200 may be formed on the inter-metal dielectric structure 100 including the openings 80, and a copper layer 300 may be formed so as to fill the openings 80.

The barrier metal 200 may be formed to improve adhesion between the copper layer 300 and the inter-metal dielectric structure 100. The barrier metal 200 may be formed of at least one of metal nitride materials such as titanium nitride (TiN) and tantalum nitride (TaN). The barrier metal 200 may be formed by chemical vapor deposition (CVD), atomic layer deposition (ALD), or the like.

A process of forming a seed Cu (not illustrated) may be performed between the process of forming the barrier metal 200 and the process of forming the copper layer 300. The seed Cu may be formed by at least one of methods such as CVD, ALD, and physical vapor deposition (PVD) so as to accelerate a growth of the copper layer 300 according to an embodiment of the inventive concept.

The copper layer 300 may be formed by electroplating which is generally used in forming a copper layer.

Figure 1D:
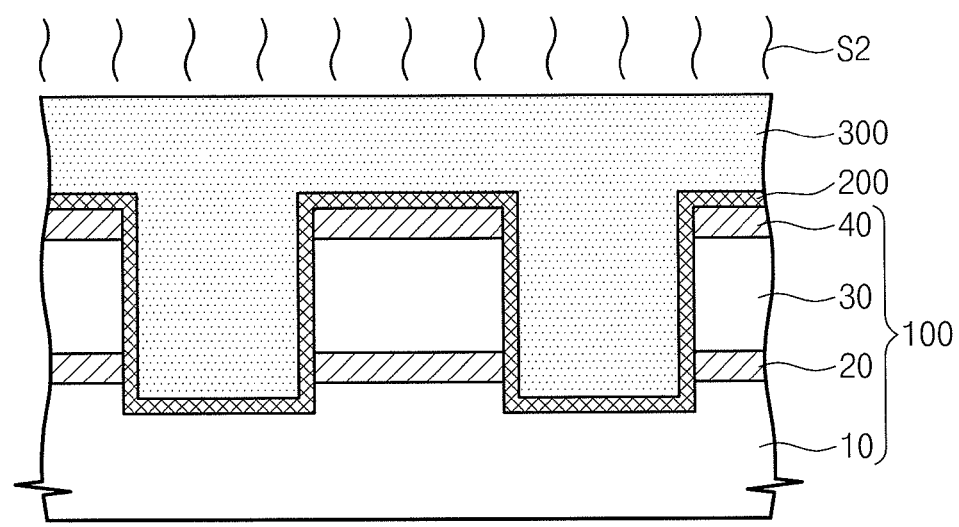
Figure 1E:
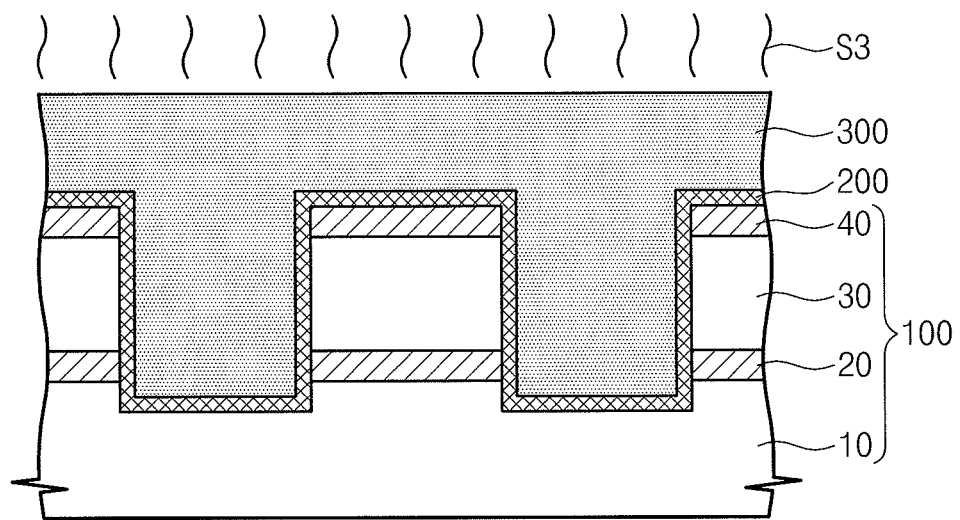

Referring to FIG. 1D, the semiconductor substrate including the copper layer 300 is subjected to a first thermal treatment (S2) at a first temperature. The first thermal treatment (S2) is performed for stabilization and crystallization of the copper layer 300. The first thermal treatment (S2) may be performed, for example, at 200° C. for five minutes.

Referring to 1E and 1F, a second thermal treatment (S3) is performed at a second temperature on a semiconductor substrate subjected to the first thermal treatment (S2), and then the semiconductor substrate including the copper layer 300 is subjected to a planarization process to form copper interconnections 350. The second thermal treatment (S3) may be performed at, for example, a temperature equal to or higher than that in the first thermal treatment (S2). The second thermal treatment (S3) may be performed in order to apply stress, which is a known to cause generation of hillocks, to the copper layer 300, the stress being caused by a difference between the temperatures of the first thermal treatment (S2) and the second thermal treatment (S3).

Figure 1F:
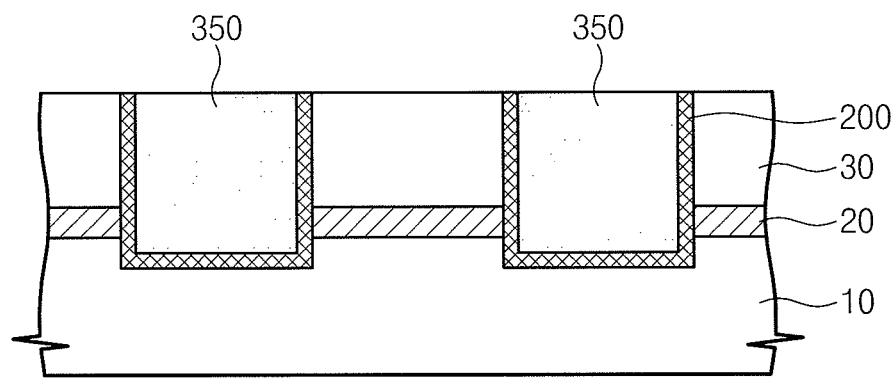

The planarization process may be performed by chemical mechanical planarization (CMP). Moreover, the planarization process may be performed to expose the upper surfaces of the copper interconnections 350 or the upper surface of the second inter-metal dielectric 30, as illustrated in FIG. 1F.

Figure 1G:
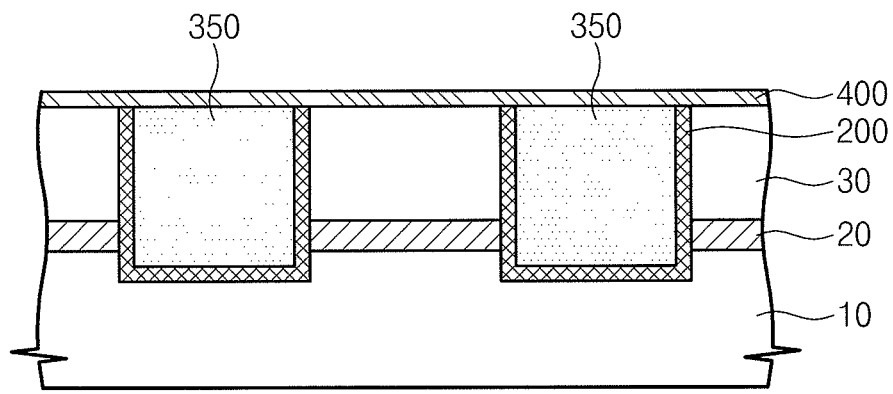

Referring to FIG. 1G, an anti-oxidation layer 400 may be formed on the copper interconnections 350 to prevent oxidation of the copper interconnections 350. In this case, the anti-oxidation layer 400 may be formed at a third temperature. The exposed copper interconnections 350 may not form self-passivation layers and may readily be oxidized to form copper oxides. The copper oxides have resistivity higher than that of pure copper. Accordingly, the anti-oxidation layer 400 may be formed so that the exposed copper interconnections 350 are not readily oxidized.

The third temperature may be substantially equal to the second temperature. That is, when the third temperature is made to be changed, the second temperature may be changed together. The stress applied to the copper interconnections 350 in the process of forming the anti-oxidation layer 400 may be reduced in the second thermal treatment (S3) performed under the same temperature condition.

Alternatively, when the process of forming the copper interconnections 350 does not include the second thermal treatment (S3), the thermal stress caused by the difference in temperature may be applied to the copper interconnections 350 during the formation of the anti-oxidation layer 400. In this case, a grain boundary is grown to cancel out the stress in the copper interconnections 350, and thus diffusion of copper atoms may occur. That is, a hillock may occur on the surfaces of the copper interconnections 350 owing to migration by the diffusion of the copper atoms in the copper interconnections 350.

However, when the second thermal treatment (S3) is performed before the formations of the copper interconnections 350 and anti-oxidation layer 400, as in the above-described embodiments of the inventive concept, the copper interconnections 350 may thermally be stabilized by applying the stress in advance, which may be applied to the copper interconnections 350 in the process of forming the anti-oxidation layer 400, to the copper layer 300 in the second thermal treatment (S3). As a consequence, the second thermal treatment (S3) may result in reducing the stress which may be applied to the copper interconnections 350 and may considerably inhibit occurrence of hillocks.

The second thermal treatment (S3) and the process of forming the anti-oxidation layer 400 may be performed at the same equipment. The process of performing the second thermal treatment (S3) may be performed in a furnace or a rapid thermal anneal (RTA) apparatus.

The process of forming the anti-oxidation layer 400 may further include a pre-thermal treatment. The pre-thermal treatment and the process of forming the anti-oxidation layer 400 are performed substantially in the same equipment. The pre-thermal treatment is performed to ensure the thermal uniformity of the semiconductor substrate and to uniformly form the anti-oxidation layer 400. The pre-thermal treatment may be performed at, for example, 400° C.

The anti-oxidation layer 400 may be formed of at least one of a silicon oxide (SiOx), a silicon nitride (SiNx), an ONO (Oxide/Nitride/Oxide), a hafnium oxide (HfOx), an aluminum oxide ($Al_2O_3$), and a multilayered oxide formed in the combination therewith. The anti-oxidation layer 400 may be formed by CVD or ALD at 400° C.

Figure 1H:
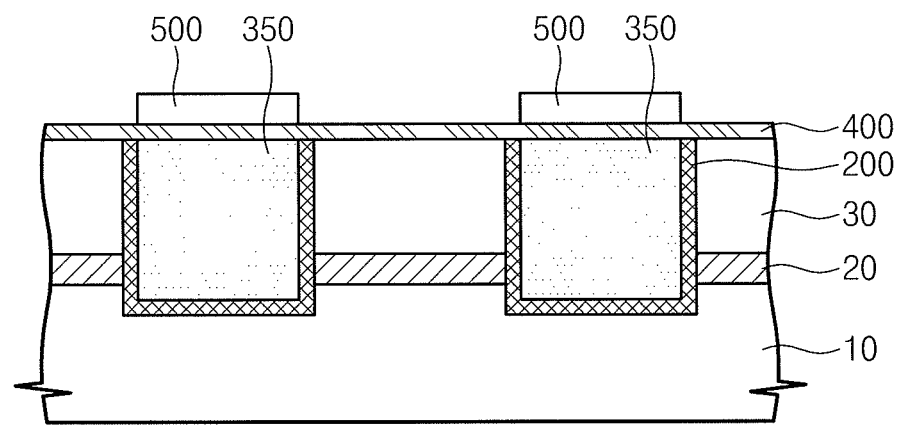
Figure 2:
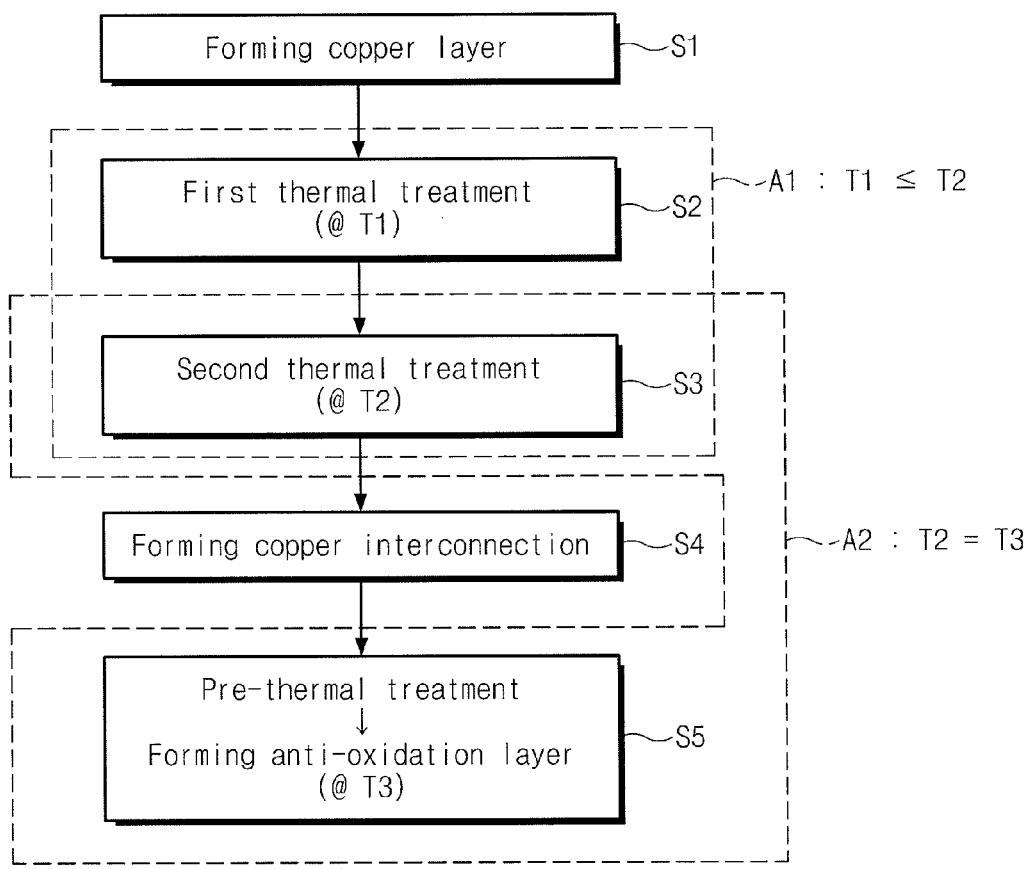
FIG. 2 is a flowchart of processes according to an embodiment of the inventive concept.

Referring to FIG. 1H, upper metal patterns 500 are formed so as to intersect the anti-oxidation layer 400. In this case, an MIM (Metal-Insulator-Metal) capacitor using the anti-oxidation layer 400 as a dielectric layer may be formed. That is, in the MIM capacitor, the copper interconnection 350 serves as a lower electrode, the anti-oxidation layer 400 serves as a dielectric layer, and the upper metal pattern 500 serves as an upper electrode. The capacitor is one of passive elements of a semiconductor device and may be formed by general methods known to those skilled in the art. For example, a capacitor having the MIM structure may be formed by sequentially stacking a dielectric layer and an upper electrode on a semiconductor substrate in which a lower electrode is formed and by simultaneously patterning the upper electrode and the dielectric layer. The characteristics of the MIM capacitor may be influenced by the topology of the dielectric layer interposed between the lower electrode and the upper electrode. That is, the characteristics of the MIM capacitor may be degraded by defects such as a hillock occurring on the surface of the lower electrode located on the lower part of the dielectric layer.

According to the embodiments of the inventive concept, the second thermal treatment (S3) may inhibit the defects of the copper interconnections 350. Moreover, the topology of the dielectric layer 400 may be improved. That is, it is possible to form the MIM capacitor in which the degradation in the characteristics is greatly reduced.

Referring to FIGS. 1A through 1H and FIG. 2, the overall process sequence of the metal interconnection method of the semiconductor device according to the embodiments of the inventive concept will be described. The copper layer 300 may be formed (S1), the copper layer 300 may be subjected to the first thermal treatment (S2), and then the second thermal treatment (S3) may be performed. In this case, the thermal treatment A1 including the first thermal treatment (S2) and the second treatment (S3) may be performed in the same equipment. Moreover, the first thermal treatment temperature T1 may be equal to or lower than the second thermal treatment temperature T2 (T1≤T2). The thermal treatments A1 may be performed before the process of forming the copper interconnections 350. That is, the first thermal treatment (S2) may be the process of stabilizing and crystallizing the copper layer 300, and the second thermal treatment (S3) may be the process of applying stress in advance, which may be applied to the copper layer 300.

Subsequently, the copper layer 300 may be patterned to form the copper interconnections 350 (S4), and then the anti-oxidation layer 400 may be formed to inhibit the oxidation of the copper interconnections 350 (S5). In this case, the process A2 including the process S3 of performing the second thermal treatment and the process S5 of forming the anti-oxidation layer 400 may be performed in the same equipment.

According to an embodiment of the inventive concept, the copper layer 300 may be patterned through the planarization process.

According to an embodiment of the inventive concept, forming the anti-oxidation layer 400 may be performed at third temperature T3 which is equal to the second thermal treatment temperature T2 (T3=T2). In this case, the stress is likely to be applied to the copper interconnections 350 due to the temperature difference, but the copper interconnections 350 subjected to no stress may be formed, as a result of the stress applied beforehand in the second thermal treatment (S3).

According to an embodiment of the inventive concept, the process S5 of forming the anti-oxidation layer 400 may include the pre-thermal treatment. According to another embodiment of the inventive concept, when the third temperature T3 at which the anti-oxidation layer 400 is formed is changed, the second temperature T2 at which the second thermal treatment is performed may be changed together.

Referring to FIGS. 1A through 1H and FIG. 3, the overall process sequence of the metal interconnection method of the semiconductor device having the MIM structure according to other embodiments of the inventive concept will be described. The copper layer 300 may be formed and first thermal treatment (S1a) and second thermal treatment (S3a) are sequentially performed on the copper layer 300. In this case, the temperature of the first thermal treatment (S2a) may be equal to or lower than that of the second thermal treatment (S3a) (T1≤T2). The thermal treatment A1a including the first thermal treatment (S2a) and the second thermal treatment (S3a) may be performed in the same equipment.

Copper interconnections 350 are formed by patterning the copper layer 300 (S4a), and the anti-oxidation layer 400 is formed on the upper interconnections 350 (S5a). The capacitor having the MIM structure is formed by depositing the upper metal 500 on the anti-oxidation layer 400 (S6a). In this case, the thermal treatment A2a including the process S3a of performing the second thermal treatment and the process (S5a) of forming the anti-oxidation layer 400 may be performed in the same equipment.

According to an embodiment of the inventive concept, the process S5a of forming the anti-oxidation layer 400 may include the pre-thermal treatment. The second thermal treatment temperature T2 may be equal to the temperature T3 (T3=T2) at which the inter-metal dielectric 400 is formed.

According to the embodiments of the inventive concept, it is possible to prevent the occurrence in the hillocks of the copper due to the thermal stress and the mechanical stress through two thermal treatments which have different temperatures, respectively. That is, the first thermal treatment is performed at the temperature lower than that of the second thermal treatment to stabilize the buried copper interconnection. The second thermal treatment is performed at the temperature at which the anti-oxidation layer is formed on the surface of the copper, thereby preventing the occurrence of hillocks due to the migration of the copper atoms caused by the stress which can be generated in the process of forming the anti-oxidation layer. In addition, since two thermal treatments are performed before the planarization process through the CMP, it is possible to prevent the occurrence of voids of the copper interconnection due to the disappearance of the copper atoms caused by the mechanical stress which can occur in the planarization process. The second thermal treatment can prevent the degradation in the characteristics of the MIM capacitor that can be fabricated by forming the upper metal on the anti-oxidation layer. Furthermore, according to the embodiments of the inventive concept, it is possible to improve the problems that can occur in the reliability of the semiconductor device due to the hillocks and voids of the copper interconnection.

The above-described subject matter is to be considered illustrative and not restrictive, and the appended claims are intended to cover all such modifications, enhancements, and other embodiments, which fall within the true spirit and scope of the inventive concept is to be determined by the broadest permissible interpretation of the following claims and their equivalents, and shall not be restricted or limited by the foregoing detailed description.

What is claimed is:

1. A metal interconnection method of a semiconductor device, comprising:
    forming a copper layer on a semiconductor substrate;
    thermally treating the copper layer at a first temperature;
    thermally treating the copper layer at a second temperature;
    forming a copper interconnection by patterning the copper layer; and
    forming an anti-oxidation layer on the copper interconnection at a third temperature,
    wherein the second temperature is substantially equal to the third temperature,
    wherein, the copper interconnection comprises a first portion of the copper layer within a first opening of a dielectric layer,
    wherein forming the copper interconnection by patterning the copper layer includes removing a second portion of the copper layer by planarization etching to expose the dielectric layer, and
    wherein the steps of thermally treating the copper layer at the first temperature and thermally treating the copper layer at the second temperature occur prior to removing the second portion of the copper layer to expose the dielectric layer and prior to any planarization etching of the copper layer.

2. The metal interconnection method of claim 1, wherein the second temperature is equal to or higher than the first temperature.

3. The metal interconnection method of claim 1, wherein the thermal treating of the copper layer at the second temperature and the forming of the anti-oxidation layer are performed in the same equipment.

4. The metal interconnection method of claim 1, wherein the thermal treating of the copper layer at the second temperature is performed in a short period of time compared to the forming of the copper layer at the first temperature.

5. The metal interconnection method of claim 1, wherein:
    the forming of the anti-oxidation layer further includes performing pre-thermal treatment on the copper interconnection, and
    a temperature at which the pre-thermal treatment is performed is substantially equal to the third temperature.

6. A method of fabricating a semiconductor device comprising:
    forming a metal layer on a semiconductor substrate;
    thermally treating the metal layer at a first temperature;
    thermally treating the metal layer at a second temperature different from the first temperature;
    patterning the metal layer to form a metal pattern;
    forming an inter-metal dielectric on the metal pattern; and
    forming an upper metal pattern on the inter-metal dielectric,
    wherein the inter-metal dielectric is interposed between the metal pattern and the upper metal pattern so as to have an MIM (Metal-Insulator-Metal) structure,
    wherein, the metal pattern comprises a first portion of the metal layer within a first opening of a lower dielectric layer,
    wherein patterning the metal layer to form the metal pattern includes removing a second portion of the metal layer by planarizationto expose the lower dielectric layer, and
    wherein the steps of thermally treating the metal layer at a first temperature and thermally treating the metal layer at a second temperature occur prior to removing the second portion of the metal layer to expose the lower dielectric layer and prior to any planarization etching of the metal layer.

7. The method of claim 6, wherein the second temperature is higher than the first temperature.

8. The method of claim 6, wherein the second temperature is substantially equal to a temperature at which the inter-metal dielectric is formed.

9. The method of claim 6, wherein the thermal treating of the copper layer at the second temperature and the forming of the inter-metal dielectric are performed in the same equipment.

10. The method of claim 6, wherein the inter-metal dielectric formed on the metal pattern includes at least one of a silicon oxide layer (SiOx), a silicon nitride layer (SiNx), an ONO layer (Oxide/Nitride/Oxide), a hafnium oxide layer (HfOx), an aluminum oxide layer (Al2O3), and a multilayered insulating layer formed in combination therewith.

11. A method of fabricating a semiconductor device comprising:
    forming a dielectric layer on a semiconductor substrate;
    then, patterning the dielectric layer, including forming first and second openings within the dielectric layer, the first and second openings being separated by a first upper surface portion of the dielectric layer;
    then, depositing a barrier layer on the patterned dielectric layer including within the first and second openings;
    then, depositing a metal layer on the barrier layer including within the first and second openings;
    then, thermally treating the metal layer at a first temperature to stabilize the metal layer;
    then, thermally treating the metal layer at a second temperature, higher than the first temperature, to apply stress to the metal layer;
    then, patterning the metal layer by planarizationto etching of the metal layer to expose the first upper surface portion of the dielectric layer,
    wherein thermally treating the metal layer at the first temperature and thermally treating the metal layer at the second temperature both occur prior to any planarization etching of the metal layer.

12. The method of claim 11, wherein the planarization etching comprises chemical mechanical polishing.

13. The method of claim 12, further comprising:
    after patterning the metal layer to expose the first upper surface portion of the dielectric, performing a third process on the patterned metal layer at a third temperature substantially equal to the second temperature.

14. The method of claim 13, wherein the third process comprises forming an anti-oxidation layer on the patterned metal layer at the third temperature.

15. The method of claim 13, wherein the third process comprises forming an inter-metal dielectric on the patterned metal layer.

16. The method of claim 13, wherein the metal layer is a copper layer.

* * * * *